(12) United States Patent
May et al.

(10) Patent No.: US 11,415,608 B2
(45) Date of Patent: Aug. 16, 2022

(54) TRANSFORMER AND SOCKET ASSEMBLY FOR POWER METER INSTALLATIONS

(71) Applicant: TSTM, Inc., Sioux Falls, SD (US)

(72) Inventors: Greg May, Sioux Falls, SD (US); Robert A. Ashford, Sioux Falls, SD (US)

(73) Assignee: TSTM, Inc., Sioux Falls, SD (US)

( * ) Notice: Subject to any disclaimer, the term of this patent is extended or adjusted under 35 U.S.C. 154(b) by 135 days.

(21) Appl. No.: 16/586,475

(22) Filed: Sep. 27, 2019

(65) Prior Publication Data

US 2021/0096163 A1 Apr. 1, 2021

(51) Int. Cl.
| | |
|---|---|
| *G01R 22/06* | (2006.01) |
| *G01R 1/04* | (2006.01) |
| *G01R 11/02* | (2006.01) |
| *H02H 9/04* | (2006.01) |
| *H01F 38/28* | (2006.01) |
| *H01R 13/11* | (2006.01) |

(52) U.S. Cl.
CPC ......... *G01R 22/065* (2013.01); *G01R 1/0416* (2013.01); *G01R 11/02* (2013.01); *H01F 38/28* (2013.01); *H01R 13/11* (2013.01); *H02H 9/044* (2013.01)

(58) Field of Classification Search
CPC .... G01R 22/065; G01R 1/0416; G01R 11/02; H02H 9/044; H01F 38/28; H01F 38/38; H01R 13/11
USPC ....................................................... 324/156
See application file for complete search history.

(56) References Cited

U.S. PATENT DOCUMENTS

| | | | | |
|---|---|---|---|---|
| 3,183,408 | A * | 5/1965 | Keller .................... | G01R 11/04 361/663 |
| 6,488,535 | B1 * | 12/2002 | Robinson ............... | H01R 33/94 439/508 |
| 2004/0254750 | A1 * | 12/2004 | Macfarlene ............ | H05K 1/116 702/61 |
| 2010/0128418 | A1 * | 5/2010 | Pruehs .................... | H02B 1/03 361/664 |
| 2013/0027818 | A1 * | 1/2013 | McGrail ................. | H01F 27/04 361/38 |
| 2014/0354386 | A1 * | 12/2014 | Adar .................... | H01F 41/0213 29/605 |
| 2019/0198238 | A1 * | 6/2019 | Adar ....................... | H01F 41/12 |

* cited by examiner

*Primary Examiner* — Christopher P McAndrew
(74) *Attorney, Agent, or Firm* — Merchant & Gould P.C.

(57) ABSTRACT

An electric meter circuit assembly is disclosed which can be used as a conversion kit or in a meter installation generally. The circuit assembly includes an electric meter adapter that has a wiring harness, a meter socket adapter having a socket face adapted to receive a plug-in meter, the meter socket adapter including a plurality of meter connections exposed at the socket face; a current transformer subassembly including a plurality of current transformers, each current transformer being associated with a phase of the multi-phase electrical service, each current transformer of the plurality of current transformers being electrically connected between a meter connection of the plurality of meter connections and a phase of the multi-phase electrical service. The circuit assembly further includes a voltage transformer subassembly electrically connected between phases of the multi-phase electrical service and electrical connections in a connector adapted to be connected to the wiring harness.

22 Claims, 11 Drawing Sheets

TRANSFORMER AND SOCKET ASSEMBLY FOR POWER METER INSTALLATIONS

TECHNICAL FIELD

The present disclosure relates generally to electric meter circuitry, and in particular to a transformer and socket assembly for power meter installations.

BACKGROUND

Electric meters have long been used to measure energy consumption at a premises of a utility service consumer. Such meters are available in many forms, and have changed significantly over time. Traditional electric meters were typically implemented as induction meters, which included pot coils that measure a voltage of a circuit to be metered, as well as current coils in series with the service to be monitored. Such coils could in turn induce movement of disks which are calibrated to rotate at a rate based on observed voltage, current and their phase relationship. Dials calibrated using such disk rotations could then be periodically monitored by a utility to determine consumption by the customer. Hence, by monitoring the voltage, current and their phase relationship delivered to a consumer, overall energy consumption and power could be determined.

Electric service that is delivered to a consumer premises, and in particular to a commercial location, may have a current delivery capability as high as 5000 amps. Such service is not typically capable of being handled by a meter. As such, this electric service was traditionally stepped down using instrument transformers to signal levels manageable by a meter.

Electric meters as are discussed above were traditionally electromechanical, in that the voltage and current phase relationship generate magnetic fields proportional to the wattage, which acts on an aluminum disk within the meter that moves (typically rotates) proportionally to real power delivered to the premises.

More recently, most of the electromechanical meters as discussed above have been transitioned (at least for new installations) to meters including solid state measurement elements, which are capable of operating across wide voltage ranges. However, such meters were designed to be backwards compatible with prior metering technologies to allow them to be installed directly in place of traditional meters. As such, these solid state meters also accommodate a 20 amp current transformer output and up to 480 volts for voltage circuits. This is the case even though the electrical burden of such solid state devices is substantially lower than that of the prior electromechanical meters. Physical and solid state meters each are typically configured to be received into a meter socket, which has electrical connections in one of a number of standard formats.

Recent solid-state meters typically come in one of two forms. First, self-contained electric meters, typically used in small business applications, are configured such that voltage and current measurement elements are electrically connected to the same terminals of an electrical interface to the meter. Such meters allow load currents to flow through the meter to a customer facility, such that all power delivered to the customer premises passes through the meter. However, in terms of installation, because self-contained meters allow the service to flow through the meter, the power line signal must be provided to the meter itself.

Second, transformer-rated meters, typically used in larger business or industrial applications, are configured such that voltages and currents received from a power line transformer are electrically connected to different terminals on the electrical interface of a meter (e.g., at the socket). Transformer-rated meters can be electrically connected to a power line transformer by one or more voltage transformers, e.g., each transformer connected to one of the phases of a three-phase power supply. Transformer rated meters generally include voltage measurement elements and current measurement elements connecting the meter to supply lines at voltage transformers and current transformers, respectively.

When installed at a customer premises, transformer-rated meters are often installed such that current transformers and voltage transformers are installed proximate to a power line source, and lead lines extend from the power line to the customer premises. This may, for example, mean that current and voltage transformers are installed on a power pole (or otherwise along power lines), with lead lines extending down/away from the power lines to the meter enclosure and associated socket, which is near/on customer premises.

Both types of meters are designed for connection to multi-phase electrical service connections. However, there are advantages and drawbacks to installation of each. For example, transformer-rated meters are often installed at factories or other large facilities, since they are able to be connected to higher voltage and current level services via current transformers and voltage transformers. Self-contained meters are generally less expensive to install, since they do not require the addition of current and voltage transformers, and complex wiring by installation personnel. Accordingly, installation of self-contained meters is relatively common.

In many instances, because of their simplicity, power utilities have opted to install self-contained meters at premises that are providing high-voltage, high-current service to customers, such as 480V service. This arrangement, however, may present significant disadvantages. For example, in some instances, high-voltage, high-current service delivered to customer premises may experience arc flash or other types of breakdown which may result in failure events at the meter. This may occur spontaneously at an installed meter, and may also occur during servicing of such meters. Furthermore, because the full supply line voltage (480V) and current (e.g., up to or exceeding 100-200 amps, or in some instances up to 600 amps) is delivered to the meter, any service at the meter will result in a service person being exposed to the full voltage and current level(s). Due to OSHA regulations (and to ensure safety of service personnel), this may require such service personnel to wear significant protective clothing when servicing or replacing such meters, since they would be exposed to significant voltage and current.

In view of these challenges of self-contained meters, electrical utilities might desire to replace self-contained meters at some types of facilities with transformer rated meters. This has one desirable effect of reducing the voltage exposed to service personnel at the meter enclosure itself once the transition has occurred. For example, in some instances it may be desirable to replace a K-base meter, which is a form of a self-contained meter but which is often used in commercial applications, with a transformer-rated meter, to reduce the voltage exposed at the meter socket. However, this transition can be a difficult, time-intensive process. For example, traditionally, replacing a self-contained meter with a transformer-rated meter would involve removal of the self-contained meter, and installation of current and voltage transformers at the place where service would branch from supply lines, then replacing the meter socket and related meter at the meter housing. This process of "replacing the loop" is significantly time-intensive and costly, and therefore, sub-optimal.

For these and other reasons, improvements in electric meter circuitry are desirable.

SUMMARY

In general, the present disclosure is related to a circuit assembly that can be installed at a customer premises that provides conversion of a self-contained meter circuit to a circuit capable of accommodating a transformer-rated meter. The circuit assembly includes, for example, a socket adapter that is installable at a socket location of the self-contained meter, but which includes electrical connections to compact assemblies of current transformers and voltage transformers that electrically connect between a multi-phase electrical service (e.g., received at the existing socket), and provide transformer isolation at a socket face of the socket adapter, which in turn can receive a transformer-rated electric meter.

In a first aspect, an electric meter conversion kit is disclosed. The kit includes an electric meter adapter including a wiring harness, a meter socket, and a current transformer subassembly. The wiring harness exposes a plurality of electrical connection sets, each electrical connection set including a plurality of electrical connections associated with each phase of a multi-phase electrical service. The meter socket adapter has a socket face adapted to receive a plug-in meter, the meter socket adapter including a plurality of meter connections exposed at the socket face. The current transformer subassembly includes a plurality of current transformers, each current transformer of the plurality of current transformers being electrically connected between a meter connection of the plurality of meter connections and a phase of the multi-phase electrical service. The kit further includes a voltage transformer subassembly including a plurality of voltage transformers and a connector, each voltage transformer being electrically connected between a phase of the multi-phase electrical service and an electrical connection of the plurality of electrical connections in the connector, wherein the connector is adapted to be connected to the wiring harness.

In a second aspect, an electric meter circuit installation is disclosed. The circuit installation includes a meter enclosure housing a meter socket, the meter socket being electrically connected to a power service comprising a multi-phase electrical service and configured to receive a self-contained electric meter. The installation further includes a voltage transformer subassembly including a plurality of voltage transformers, each voltage transformer being electrically connected to a phase of the multi-phase electrical service and having a voltage output. The installation also includes a meter socket adapter having a connection interface adapted to be connected into the meter socket and a socket face including a plurality of meter connections adapted to accept a transformer-rated meter, as well as a current transformer subassembly including a plurality of current transformers, each current transformer being electrically connected between a meter connection of the plurality of meter connections and a phase of the multi-phase electrical service.

In a third aspect, a method of retrofitting a transformer-rated meter into a meter socket adapted for use with a self-contained meter is disclosed. The method includes installing a voltage transformer subassembly within an electric meter enclosure, the voltage transformer subassembly including a plurality of voltage transformers, and installing a meter socket adapter into a meter socket adapted for use with a self-contained meter, the meter socket adapter including a socket face having a plurality of meter connections adapted to accept a transformer-rated meter, wherein the meter socket adapter includes a current transformer subassembly including a plurality of current transformers. The method also includes electrically connecting the voltage transformer subassembly to a multi-phase electrical service and the meter socket adapter to isolate the meter connections in the socket face from the multi-phase electrical service and installing a transformer-rated meter into the socket face.

DETAILED DESCRIPTION

As briefly described above, embodiments of the present invention are directed to an electrical circuit assembly useable as an electric meter conversion kit, an electrical meter circuit assembly, and a method of retrofitting an electric meter connection. In accordance with the present disclosure, existing self-contained metering arrangements may be easily converted to transformer-rated metering arrangements without significant labor. Compact voltage and current transformer elements can be used in conjunction with a socket adapter that can be used to convert a self-contained meter socket format to a transformer-rated meter socket format. Such a circuit assembly may be substantially entirely housed within an existing metering enclosure.

Figure 1:
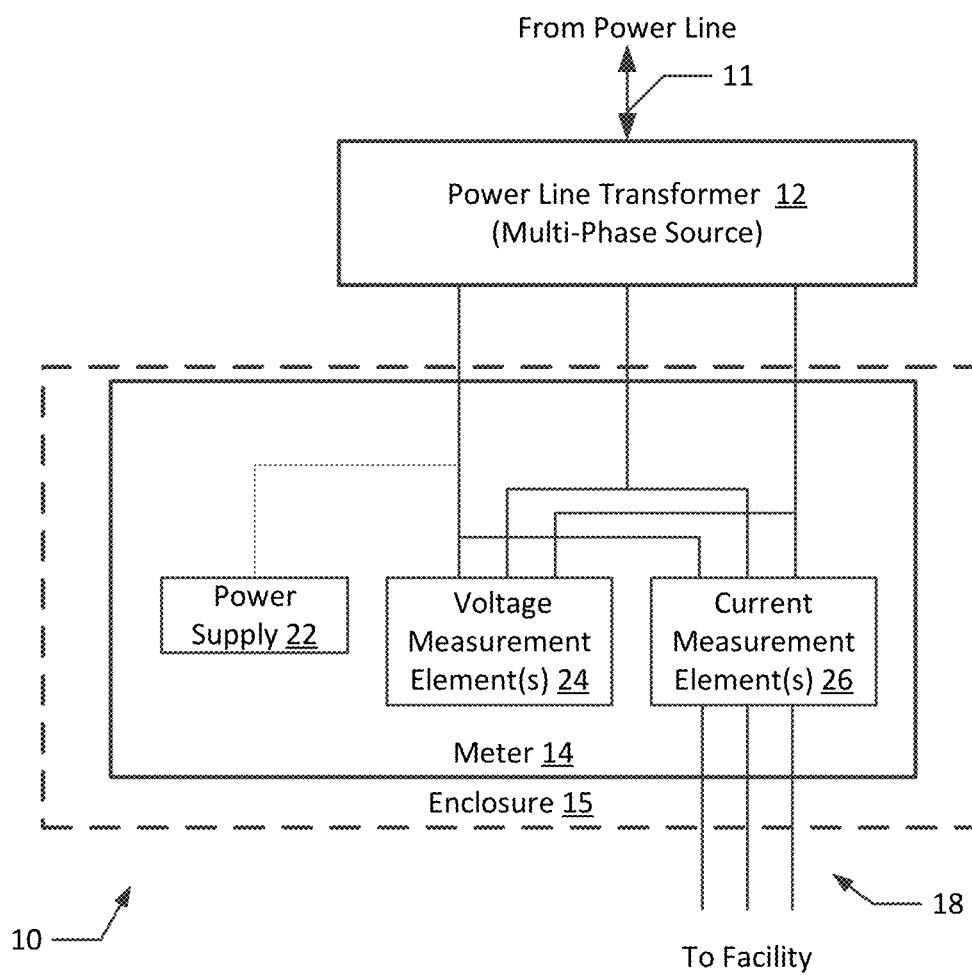
FIG. 1 is a schematic diagram of example electrical connections to a self-contained electric meter.

FIG. 1 is a schematic diagram of a circuit 10 illustrating example electrical connections to a self-contained electric meter 14. In the example shown, voltages and currents received from a power line transformer 12 (e.g., connected to a power line 11) are electrically connected directly to a power supply 22 of the electric meter 14, as well as to voltage measurement elements 24 and current measurement elements 26. Electrical service passes through the meter 14, with electric service 18 being provided to a facility. The electric meter 14 is typically located within an enclosure 15 which is proximate to the facility. Such self-contained electrical meters 14 are often used in small business applications or residential applications.

Figure 2:
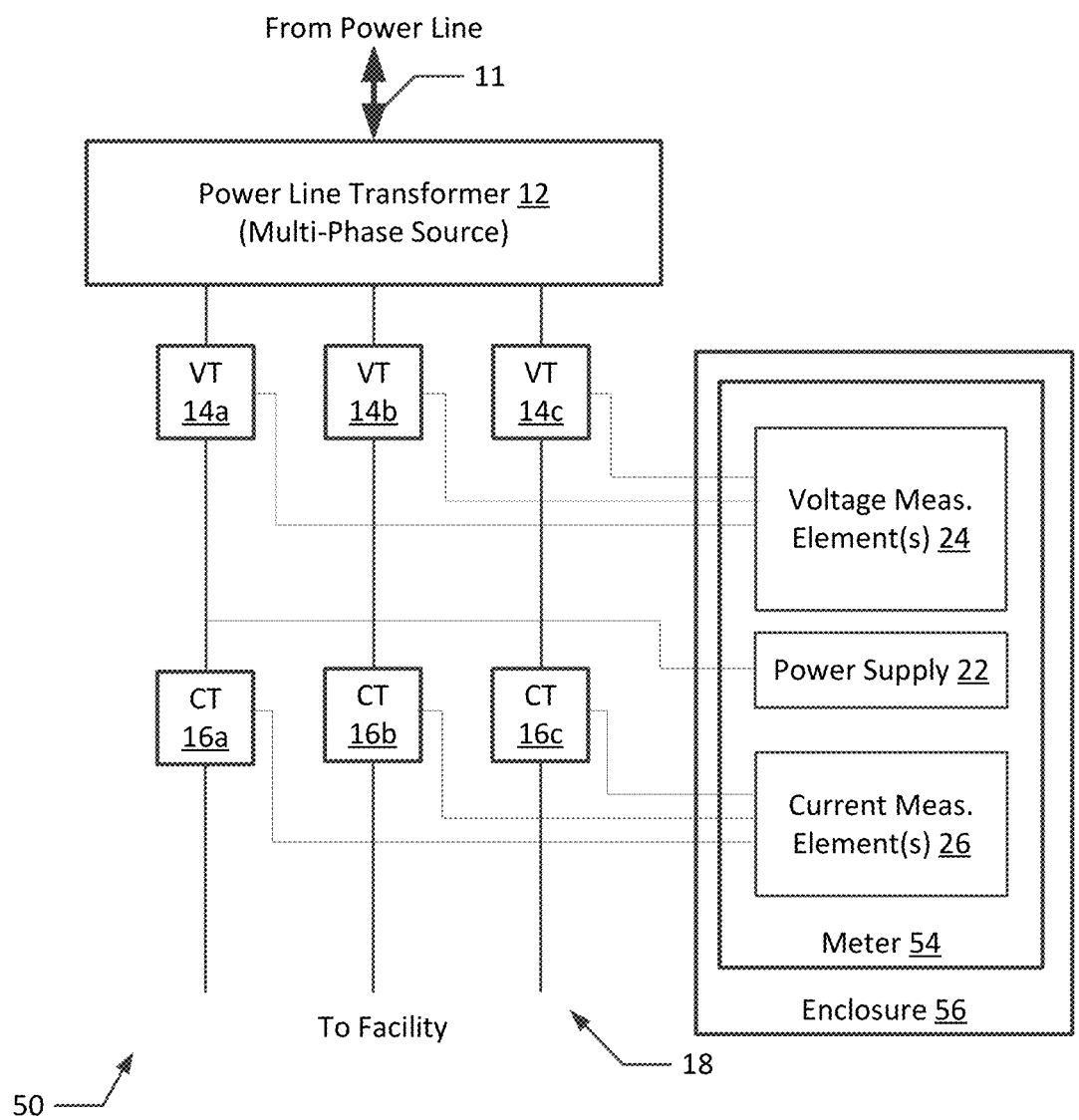
FIG. 2 is a schematic diagram of example electrical connections to a transformer-rated electric meter.

As seen in FIG. 2, a transformer-rated electric meter installation may be used in larger business or industrial applications, and is configured such that voltages and currents received from a power line transformer 12 (e.g., connected to a power line 11) are electrically connected to different terminals on the electrical interface of a meter 20. For example, transformer-rated meters 54 can be electrically connected to a power line transformer 12 by one or more voltage transformers 14 (shown as transformers 14a-c, in each of three phases of a power supply). In particular, transformer-rated meters 20 include voltage measurement elements 24 and current measurement elements 26, respectively, connecting the meter 54 to supply lines at voltage transformers 14a-c, and current transformers 16a-c, respectively. A power supply 22 is electrically connected to one of the phases of the power supply, for example the "A" phase as shown in FIG. 1. Power to the facility 18 is passed through the voltage transformers and current transformers 14a-c, 16a-c, respectively, without passing through the meter 54. Rather, the meter monitors power on the supply lines extending from the power line transformer 12 via transformer outputs. Such a transformer-rated meter 54 is likewise positioned within an enclosure (e.g., enclosure 56) which is located proximate to a facility receiving the electrical service connection. The voltage transformers 14a-c and current transformers 16a-c will, if in an original installation, typically be positioned near the power line transformer 12, and provides circuit isolation between the premises and the power line.

Figure 3:
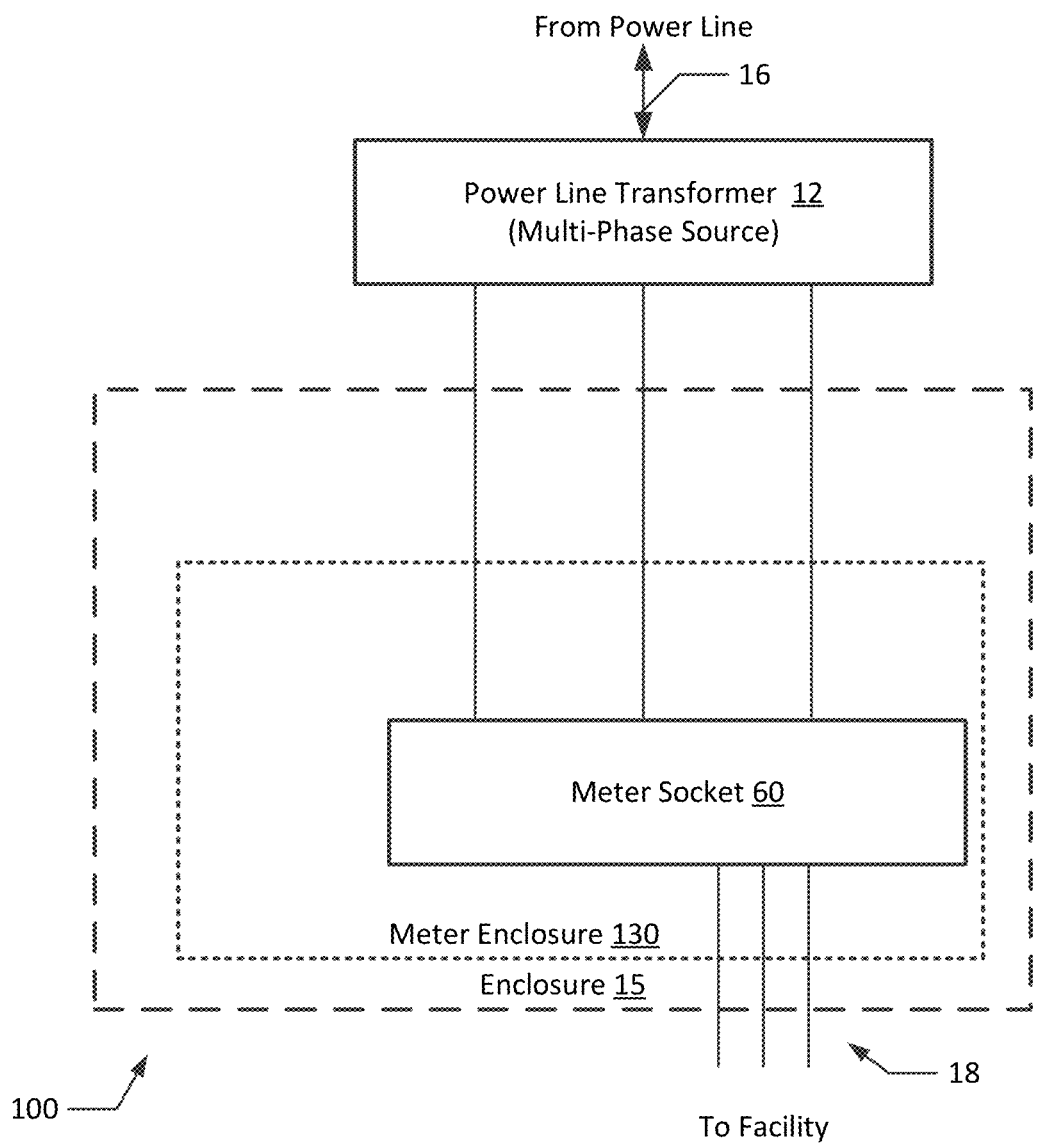
FIG. 3 is a schematic diagram of an example self-contained electric meter installation.
Figure 4:
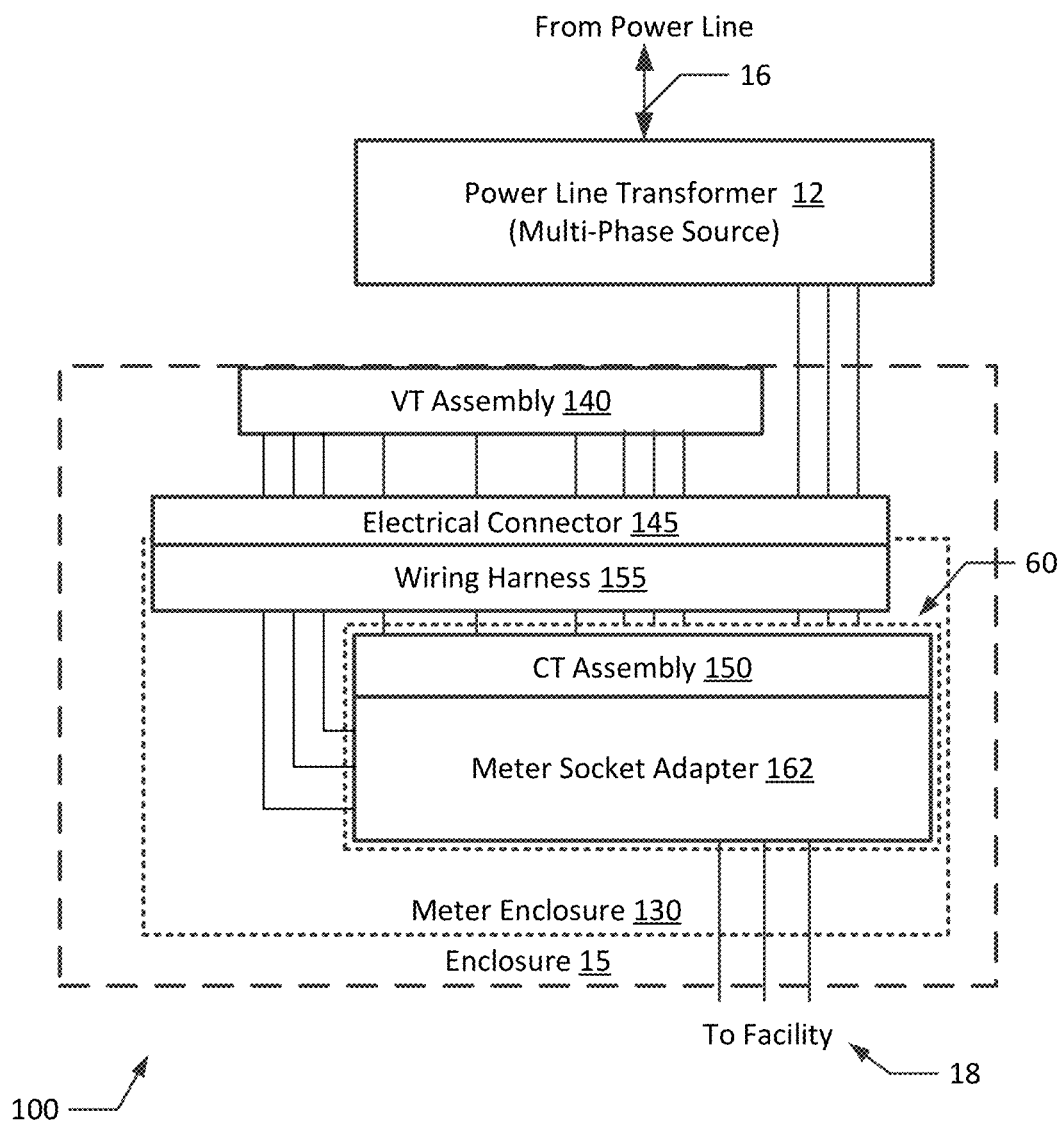
FIG. 4 is a schematic diagram of an example electric meter installation including a transformer-rated meter installed using an electric meter adapter circuit assembly, according to aspects of the present disclosure.

Now referring to FIGS. 3-4, an example replacement of a self-contained electric meter with a transformer-rated electric meter is shown, in schematic form. In accordance with the present disclosure, a meter socket positioned within a meter enclosure may receive an adapter and associated circuitry to convert that electric meter socket from a self-contained electric meter socket to a transformer-rated electric meter socket. FIG. 3 shows a meter configuration 100 analogous to the meter configuration seen in FIG. 1. In particular, a Howard buying transformer 12 receives a multi-phase electrical service from a power line 16 and provides the multi-phase electrical service directly to a meter socket 60. If the meter socket 60 is positioned within a meter enclosure 130 which may itself be positioned within an enclosure 15. Power signals directed to a facility 18 are connected directly to the meter socket 60. Accordingly, the meter socket 60 is configured for use with a self-contained electric meter.

Referring now to FIG. 4, the meter configuration 100 is shown with an electric meter adapter arrangement if installed within the enclosure 15, and optionally meter enclosure 130. In the embodiment shown, the multi-phase how our signal received from the power line transformer 12 is routed to a voltage transformer assembly 140. The voltage transformer assembly 140 can be, for example, mounted within enclosure 15.

Figure 5:
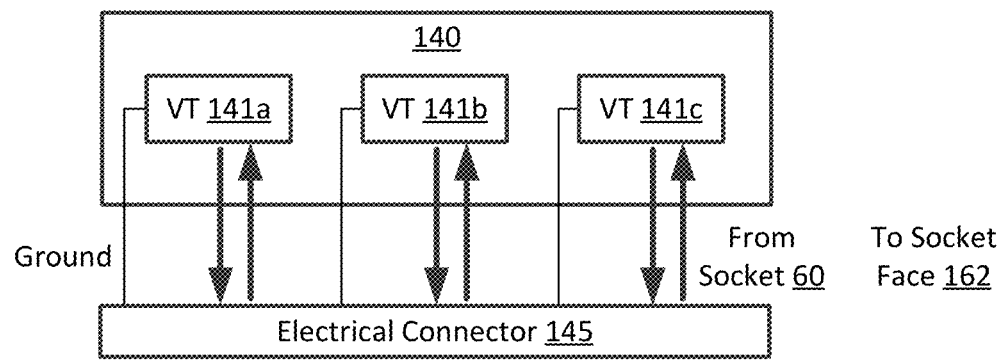
FIG. 5 is a schematic diagram of a voltage transformer assembly useable to implement aspects of the present disclosure.

In the embodiment shown the voltage transformer assembly 140 has input connections and output connections that are terminated at electrical connector 145. In some embodiments, the voltage transformer assembly 140 can be housed within a compact housing that is mountable within enclosure 15. The voltage transformer assembly 140 may have wiring extending from such a housing, terminating at the electrical connector 145. As seen in more detail in FIG. 5, in an example embodiment, the voltage transformer assembly 140 includes a plurality of voltage transformers 141, shown as voltage transformers 141a-c. Each voltage transformer 141 is electrically connected to one phase of the multi-phase electrical signal. Each voltage transformer 141 also has an output power signal and a secondary output signal, both of which are routed to electrical connector 145.

In example embodiments, the voltage transformer assembly 140 is implemented using a VT Pack available from TSTM, Inc. of Sioux Falls, S.D. In other embodiments, discreet modular transformers may also be used, such as the FlexPack modular transformer connection system also available from TSTM, Inc. of Sioux Falls, S.D. In such embodiments, the voltage transformers included in the voltage transformer assembly 140 are toroidal autotransformers. Other types of transformers may be used as well.

In some embodiments, a selective, modular transformer system may be used, such that a configurable number of transformers may be included in such a system (e.g., to accommodate the various meter forms discussed in further detail below). One example of a modular transformer system useable in conjunction with the methods and circuits of the present disclosure is described in U.S. Pat. No. 9,824,809, entitled "Modular Transformer System", the disclosure of which is hereby incorporated by reference in its entirety. Even in such an arrangement, preferably such a transformer system will be used in conjunction with a wiring harness as discussed herein, for convenient connection between transformers and the meter socket.

Referring back to FIG. 4, within the meter enclosure 130, the meter socket 60, which is adapted for use with a self-contained electric meter, receives a meter socket adapter 162. The meter socket adapter 162 includes a socket face that is adapted to receive a transformer-rated meter, such as in the examples of FIGS. 7-10, below.

Figure 6:
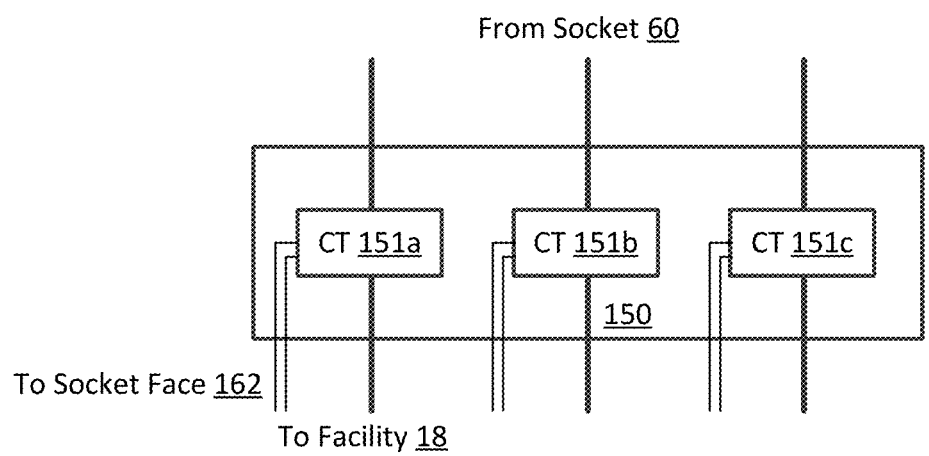
FIG. 6 is a schematic diagram of a current transformer subassembly useable to implement aspects of the present disclosure

The meter socket adapter 162 also includes a current transformer assembly 150. A schematic diagram of a current transformer assembly 150 is seen in FIG. 6. In that illustration, the current transformer assembly 150 includes a plurality of current transformers 151. In the example shown in which a three-phase electrical service is provided, three current transformers 151a-c are shown. The current transformers are connected between a service connection of a phased of the electrical service (which arrives at socket 60 from the power line transformer 12, seen in FIG. 1) and a facility-side connection of the electrical service. The current transformers have transformer output connections that are routed to the socket face of the meter socket adapter 162.

In example embodiments, the current transformer assembly 150 is placed within the meter enclosure 130, and optionally on a rear side of the meter socket adapter from the socket face. The meter socket adapter 162 and current transformer assembly 150 are electrically connected to a wiring harness 155, which extends from the meter socket 60 and is electrically connected to the meter socket adapter 162 and current transformer assembly 150 by wiring (shown schematically as circuit lines in FIG. 4). In the example shown, the electrical connector 145 that is connected to wiring extending from the voltage transformer assembly 140 is adapted for interconnection with the wiring harness 155. The electrical connector 145 and the wiring harness 155 are disconnectable to allow individual replacement of the voltage transformer assembly 140 or meter socket adapter 162, as needed, during service/repair.

In the example shown, the wiring harness 155 provides interconnections to the voltage transformer assembly 140 from the meter socket 60, the meter socket adapter 162, and the current transformer assembly 150 when connected to the electrical connector 145. In particular, as noted above, the meter socket 60 has input electrical service connections at electrical stabs that are included in the socket—in particular, at least three electrical connections in the meter socket 60, as shown, correspond to three phases of an electrical meter service. This electrical service is routed directly to meter socket 60, since electrical service runs directly to a self-contained meter. Those electrical service connections, which correspond to the multi-phase electrical signal, are routed via the wiring harness 155 and electrical connector 145 (when interconnected) to the voltage transformer assembly 140, and in addition are electrically connected to current transformers of the current transformer assembly 150, as noted above.

Notably, the socket face of the meter socket adapter 162 is configured to receive electrical connections from the voltage transformer assembly 140 and current transformer assembly 150, with the connections from voltage transformer assembly 140 to the socket face being routed back through the electrical connector 145 and wiring harness 155 by which service connections are provided to the voltage transformer assembly 140. In addition, grounding connections of the meter socket 60 will be electrically connected to the current transformer assembly 150 and socket face, as well as to the voltage transformer assembly 140 via the wiring harness 155 and electrical connector 145.

As a result of the interconnections provided by the wiring harness 155 and electrical connector 145, the voltage transformer assembly 140 and current transformer assembly 150 are each electrically connected to the multi-phase electrical service, and each provide outputs that are electrically connected to the socket face of the meter socket adapter 162. Shared grounding connections ensure a common ground among each of the transformers and an associated electrical meter. As such, to the extent such connections are routed to appropriately-positioned electrical connections at a socket face of a meter socket adapter 162, the socket face of such an adapter will be configured to receive a transformer-rated electric meter, rather than the socket 60 which was configured to receive a self-contained meter.

Referring now to FIGS. 7-10, specific circuit arrangements (or portions thereof) are disclosed that provide electrical signal routing and equipment that allow metering installations originally configured for use with self-contained meters to accommodate transformer-rated meters. Generally, each of the circuit arrangements seen in FIGS. 7-10 includes circuitry and features that correspond generally to the meter socket adapter 162, current transformer assembly 150, and wiring harness 155 seen in FIG. 4; the voltage transformer assembly 140 and electrical connector 145 may be selected for use with, and connected to, such a circuit arrangement as described above.

Figure 7:
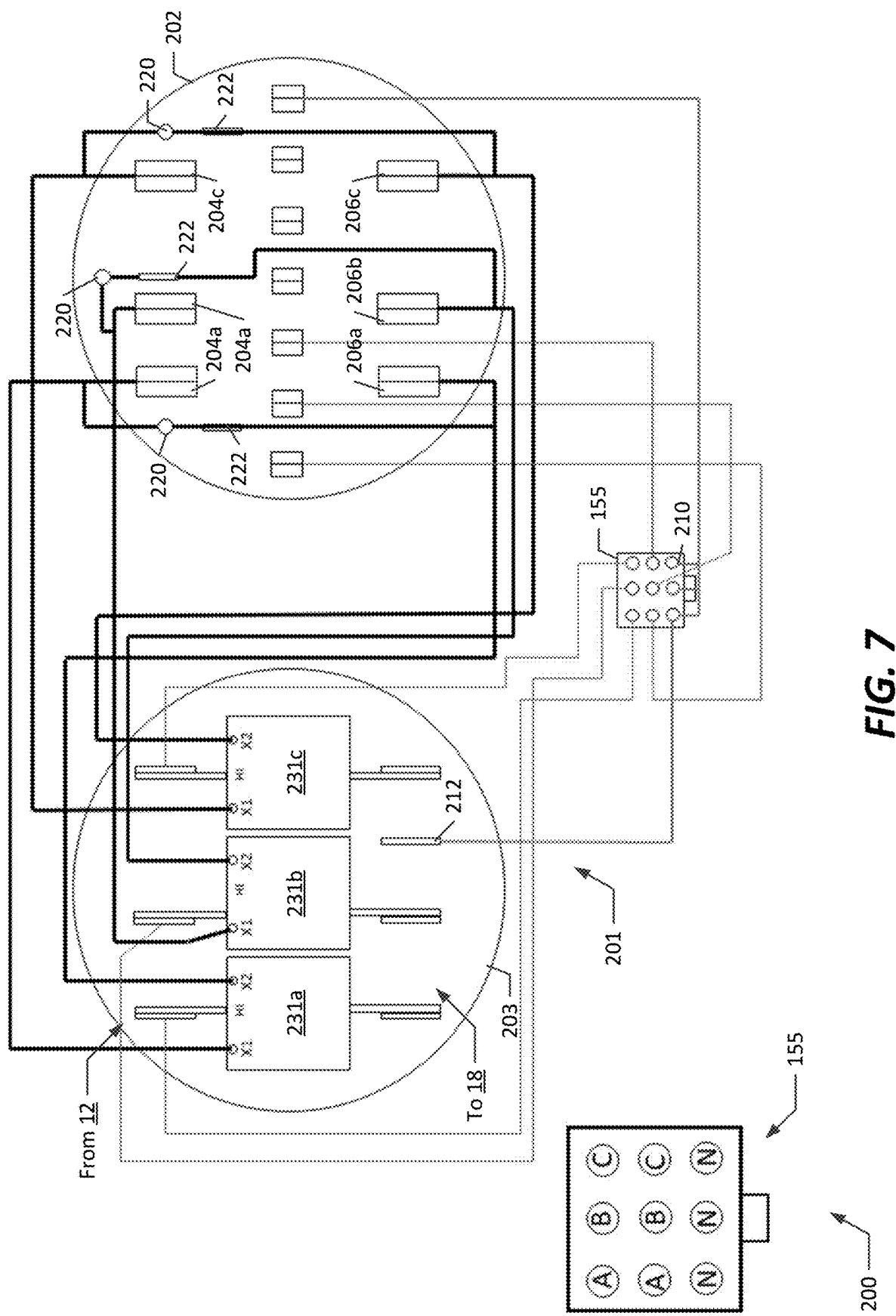
FIG. 7 is a schematic diagram of a portion of an electric meter conversion kit useable in conjunction with a socket configured for a 16S self-contained meter.
Figure 8:
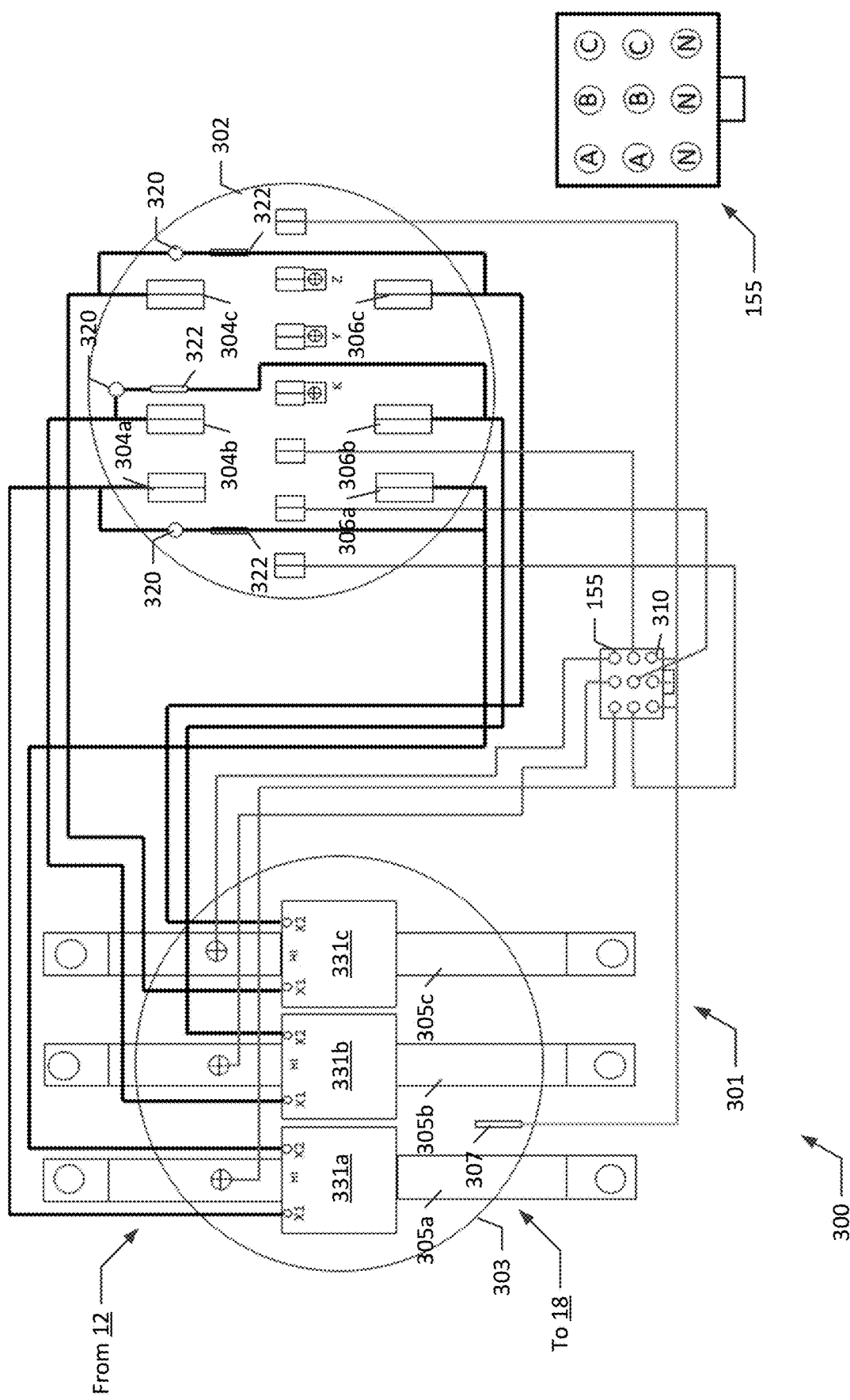
FIG. 8 is a schematic diagram of a portion of an electric meter conversion kit useable in conjunction with a socket configured for a K7 self-contained meter.

Referring first to FIG. 7, an example electric meter conversion kit 200 is shown for use in conjunction with a meter socket that is originally constructed to accommodate a form 16S self-contained meter. In the example shown, the electric meter conversion kit 200 can be used to accommodate a form 9S transformer-rated meter at the location intended to receive the form 16S meter.

In the example shown, the electric meter conversion kit 200 is seen in schematic form, and includes a meter socket adapter 201 having a front face 202 and a rear side 203. The meter socket adapter 201 generally has the functionality of meter socket adapter 162 described above in connection with FIG. 4, but specific to the conversion between Form 9S and form 16S.

The front face 202 exposes a plurality of meter connections; in this example, the meter connections that are used correspond to those used for the form 9S transformer-rated meter, as noted above. At the front face 202, a subset of the meter connections, shown as connections 204a-c are used for input current connections, and a second subset of the meter connections, shown as connections 206a-c, are used for output current connections. Each input current connection 204 has a corresponding output current connection, such that when a transformer-rated meter is installed in the front face, a closed circuit is formed across a given pair of connections that meets, within the meter, at a current measurement element (as in the current measurement element 26 of FIG. 2).

In the example shown, at the front face 202 each connection 204 is electrically joined to a corresponding connection 206 by a circuit paths including a light emitting diode 220 (LED) and a resistor 222. When a meter is not installed at the front face 202, the circuit path will electrically join connections 204, 206, and the LED 220 will be illuminated. When a meter is installed at the front face 202, because the meter forms an approximate closed circuit across connections 204, 206, the circuit path between connections 204, 206 will be bypassed, and therefore the LED 220 will not be illuminated (since the resistance of the resistor 222 is selected to be significantly greater than a resistance across meter connections 204, 206 when the meter is in place). In this way, the LED 220 will be illuminated in the absence of a meter and when electrical power is being delivered to the front face of the meter socket adapter 201.

Additionally at the front face of the meter socket adapter 201, a further subset of meter connections 208a-c receive electrical connections from wires that are connected to the wiring harness 155; these electrical connections at the wiring harness would, when a voltage transformer assembly 140 is electrically connected, be connected to an output side of respective voltage transformers 141a-c.

Further, as noted above, at least one meter connection is electrically connected to a grounding terminal 210 of the wiring harness 155. In the example shown, the wiring harness 155 will include three grounding terminals that are interconnected, with at least one of those grounding terminals connected to the grounding connection on the front face, and also at least one grounding terminal connected to a ground connection 212 at the rear side 204. The grounding connection 212 can be electrically connected to a grounding terminal 210 within the form 16S socket format that would be positioned behind the meter socket adapter 201.

In the example shown, the electric meter conversion kit 200 further includes a current transformer assembly 230, in this instance illustrated as current transformers 231a-c located on a rear face 232 of the meter socket adapter 201. The current transformers 231a-c generally correspond two current transformers 151a-c, and are electrically connected on a primary side between a phase of a multi-phase electrical service and a service delivery connection on a facility side.

The secondary side connections of the current transformers 231*a-c* are then electrically connected to connections 204, 206.

The electric meter conversion kit 200, as noted above, can include a voltage transformer assembly electrically connectable to the wiring harness 155, such that the wiring harness 155 electrically connects a phase of a multi-phase electrical service to a primary side of each voltage transformer (e.g., transformers 141*a-c*).

A wiring arrangement of the wiring harness 155 is also seen in FIG. 7; as illustrated, each phase (shown as phases A, B, C) of a multi-phase electrical service is associated with a grouping of electrical connections in the wiring harness. Each grouping includes two electrical connections and a grounding connection. One of the electrical connections is connected to the phase of the electrical service, while the other of the electrical connections is connected to a meter connection on the front face 202.

It is noted that, in some variations, socket 60 (or other equivalent sockets constructed to receive a self-contained meter) may not be maintained within an electrical meter enclosure. Rather, in such instances, it may be that the socket is removed, leaving bus bars or other electrical connection elements that allow for direct connection to the electrical service. In such instances, the above-described circuit routing remains the same, but rather than the meter socket adapter 162 having a rear portion that is oriented for interconnection to a socket configured for a self-contained meter, the rear portion of the adapter 162 is instead configured for electrical connection directly to bus bars or other wiring used for delivery of the electrical service to the facility associated with the electrical metering location. Such an arrangement is seen in the variation depicted in FIG. 8, which illustrates a portion of an electric meter conversion kit 300 useable in conjunction with a socket configured for a K7 self-contained meter.

Generally, the conversion kit 300 is analogous to kit 200 of FIG. 7, but is adapted to convert between a K7 format meter and a form 9S transformer-rated meter. In particular, the conversion kit 300 includes meter socket adapter 301, which has a front face 302 analogous to front face 202 of kit 200. Kit 300 differs from kit 200 in that in this embodiment, a current transformer assembly 330 at a rear side 303 of the meter socket adapter 301 includes current transformers 331*a-c* which are directly connected to bus bars 305*a-c*, rather than to a meter socket. This is because, for example, a K7 meter is directly connected to bus bars rather than installed at a socket. A grounding connection 307 is electrically connected to the grounding connections 310 of the wiring harness. Electrical connections between the meter socket adapter 301 and wiring harness 155 are otherwise analogous to those seen in FIG. 7, with connections 304*a-c*, 306*a-c* connected to the secondary winding side of current transformers 331*a-c*, respectively, with bypass paths across LEDs 320 and resistors 322.

Figure 9:
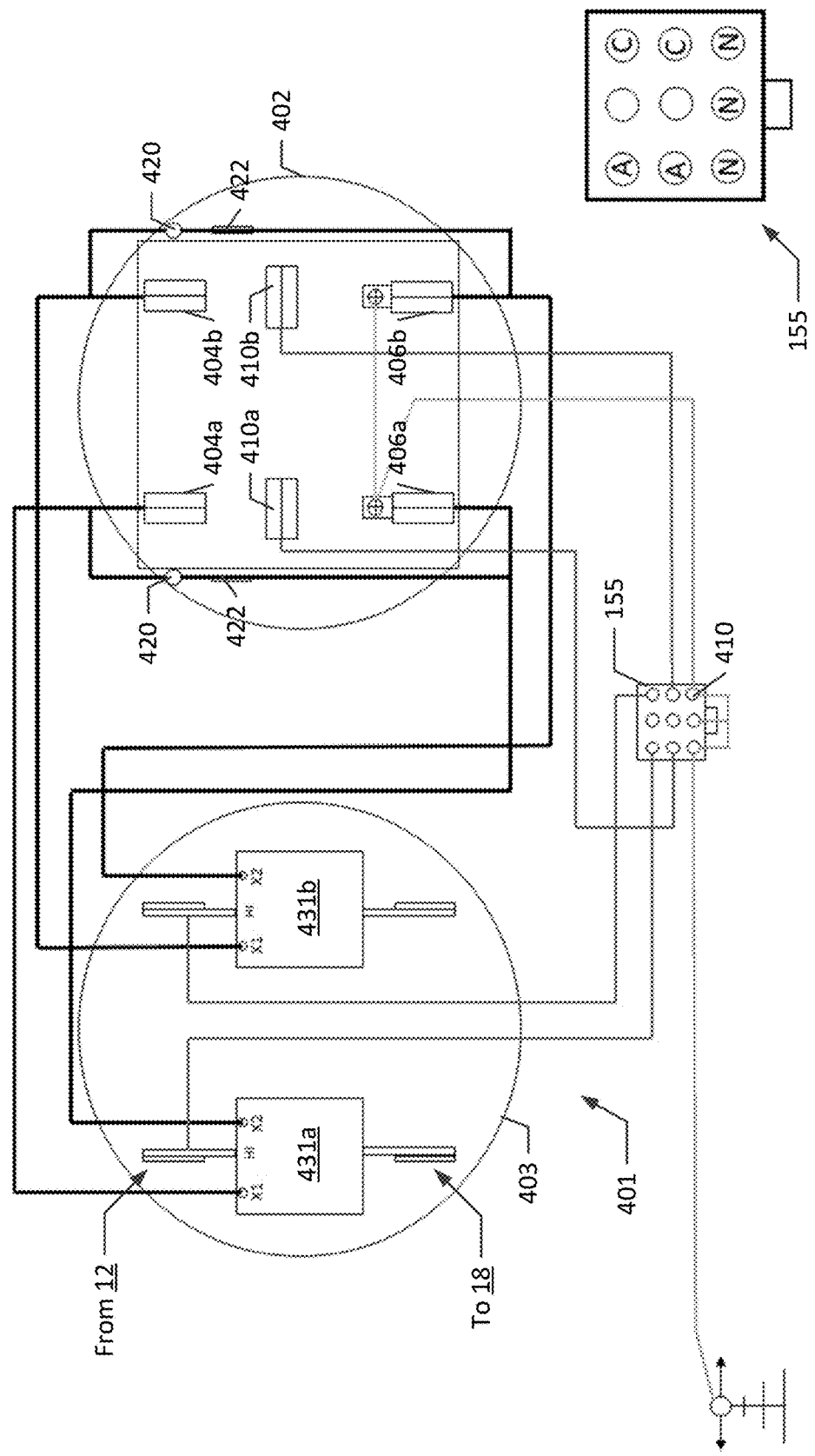
FIG. 9 is a schematic diagram of a portion of an electric meter conversion kit useable in conjunction with a socket configured for a 2S self-contained meter.
Figure 10:
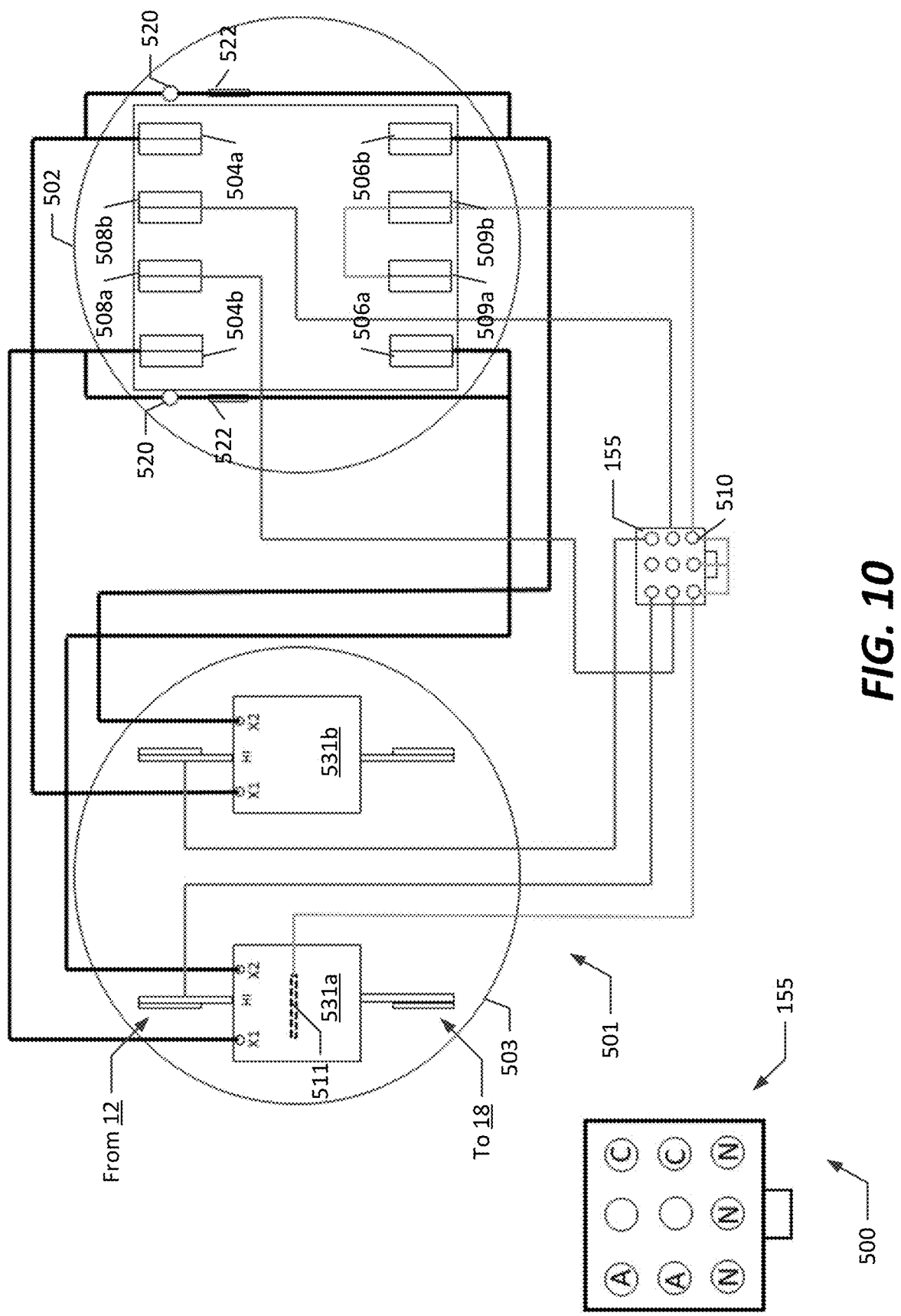
FIG. 10 is a schematic diagram of a portion of an electric meter conversion kit useable in conjunction with a socket configured for a 12S self-contained meter.

FIGS. 9-10 illustrate further example configurations of meter socket adapters that may adopt differing configurations of current transformers and voltage transformers based on the electrical service provided and types of electrical meters (self-contained and transformer-rated) that the meter socket adapter is intended to convert between. FIG. 9 illustrates a conversion kit 400, which converts between a form 2S self-contained meter and a form 4S transformer-rated meter. Such an arrangement may be applicable in circumstances where a two phase electrical service is provided to the premises.

In the embodiment shown, a form 2S self-contained meter is adapted for use with a two phase electrical service. In the example shown, this can correspond, for example, to a standard 120/240 V service for residential and commercial applications. In this case, the conversion kit 400 includes a meter socket adapter 401 having a front face 402 and a rear side 403. The front face has a plurality of electrical connections, including connections 404*a-b* and connections 406*a-b*, which are connected to the secondary side of current transformers 431*a-b*, included in a current transformer assembly 430 on the rear side 403. As with the kits 200, 300 above, the connections 404*a-b* and 406*a-b* are electrically connected by an LED 420 and resistor 422, operation of which is analogous to the description above with respect to FIG. 7. Voltage metering connections 408*a-b* are electrically connected to the wiring harness 155 for electrically connecting to a 2-transformer voltage transformer assembly, analogous to the three-transformer assembly described in connection with FIGS. 4-5, above.

In this configuration, connections 406*a-b* are also electrically connected to a ground connection 410 at the wiring harness 155. It is noted that there is no separate ground connection on the rear side 403 of the meter socket adapter 401; rather, grounding is provided for the voltage transformers and the transformer-rated meter (extending from connections 406*a-b* at front face 402) at connections 410 of the wiring harness 155.

It is noted that because in this example wiring harness 155 corresponds to the wiring harnesses described above that are useable with three-phase service, two connections in the wiring harness may remain unused. As such, the wiring harness 155 may still be connection-compatible with a voltage transformer assembly 140 described above that utilizes three voltage transformers 141*a-c*, but one of those transformers will remain unused after installation. Nevertheless, for convenience of installation and cross-compatibility of voltage transformer assemblies, use of a standardized connector on the wiring harness 155 may be advantageous.

Similar to FIG. 9, FIG. 10 illustrates a portion of an electric meter conversion kit 500 that is useable to convert a socket compatible with a form 12S self-contained electrical meter into a socket capable of accepting a form 35S or for 45S transformer-rated electrical meter. In this example, a two-phase electric service is received at the form 12S meter socket, e.g., two of three phases of a three-phase electrical service, resulting in a 120V/208V service. As shown, a meter socket adapter 501 includes a front face 502 and a rear side 503. Electrical connections 504*a-b*, 506*a-b* on the front face 502 are positioned differently, but are electrically connected using the conversion kit in a manner generally analogous to those described above in connection with FIG. 9, i.e., connecting to current transformers 531*a-b* of a current transformer assembly 530, and forming bypass paths between connections 504*a-b* and 506*a-b* via LEDs 520 and resistors 522. Electrical connections 508*a-b*, extending from connections at the wiring harness 155 leading from voltage transformers of a voltage transformer assembly, can electrically connect to a voltage measurement element when a meter is installed at the front face 502.

However, in this example, ground connection 510 of wiring harness 155 electrically connects to both separate grounding connections 509*a-b* on the front face of the meter socket adapter 501, as well as to a separate electrical connection 511 that is at a perpendicular orientation to service connections to which the current transformers 531a-b are connected (typically a common or neutral line that is then grounded when service is routed to customer premises).

In accordance with the arrangements seen in FIG. 7 and FIG. 10, it is noted that an electrical service into a Form 16S meter socket or a Form 12S meter socket utilizing a 600V service at up to 400 Amps maximum current (320 Amps continuous) can be accommodated, with significantly lower current and voltage being presented at the socket face of the meter socket adapter. In some instances, the voltage can be reduced by a 2.5:1 voltage transformers in the voltage transformer assembly, and 200:5 ratio current transformers in the current transformer assembly 230, 530. Other types of current and voltage transformers could be used as well, in alternative embodiments.

Figure 11:
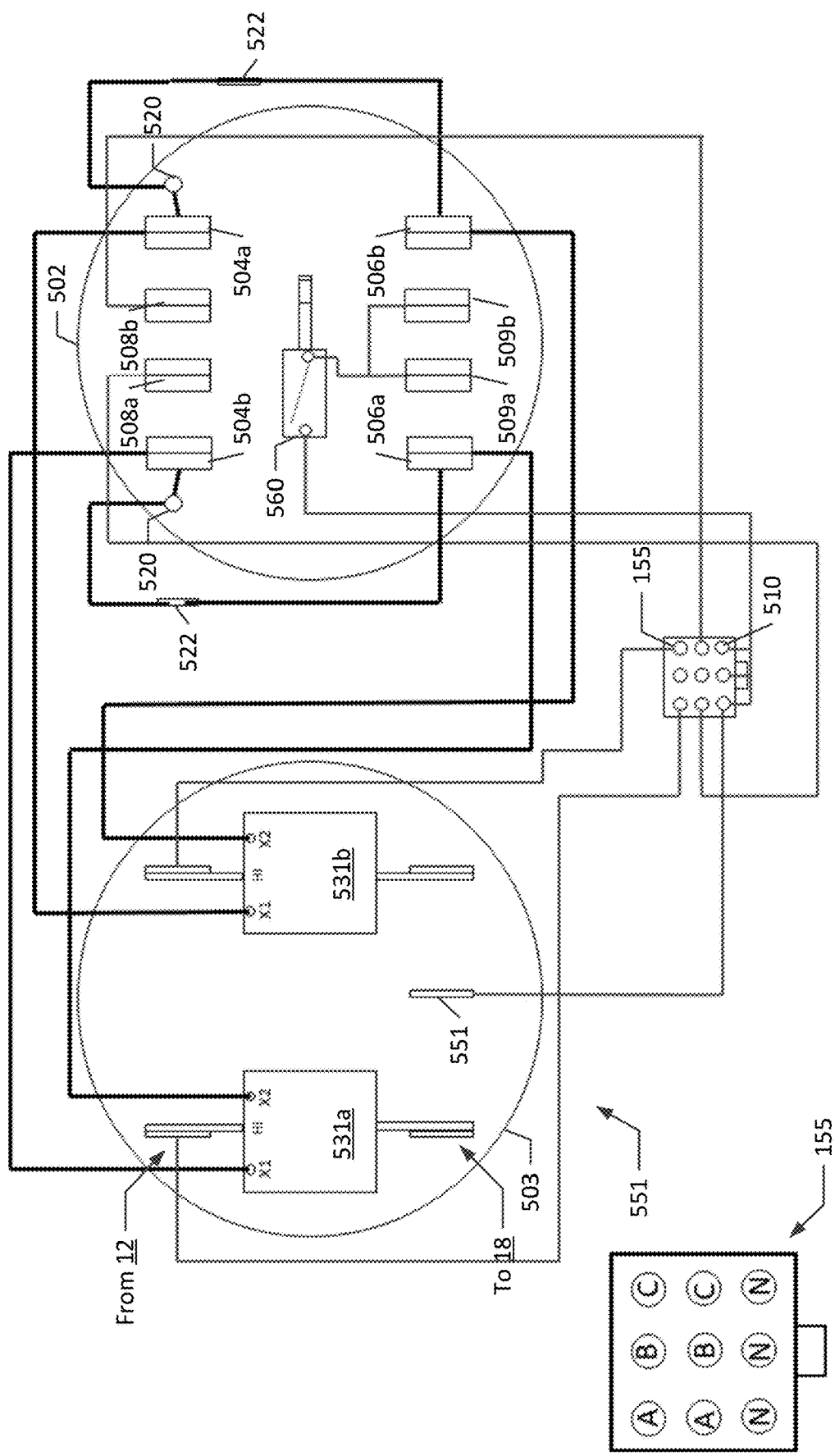
FIG. 11 is a schematic diagram of a portion of an electric meter conversion kit useable in conjunction with a socket configured for a 12S self-contained meter, using a snap switch configuration, in an example embodiment.

Referring now to FIG. 11, a further embodiment of an electric meter conversion kit 550 is shown. The electric meter conversion kit 550 is generally a modified version of the electric meter conversion kit 500 of FIG. 10, and similarly is useable to convert a socket compatible with a form 12S self-contained electrical meter into a socket capable of accepting a form 35S or for 45S transformer-rated electrical meter. However, as compared to the connection arrangement seen in FIG. 10, the electric meter conversion kit 550 does not electrically connect to a separate electrical connection 511. Rather, electrical connections 509a-b electrically connect to ground connection 510 of the wiring harness 155, as does a lower-center electrical connection 551. Furthermore, in this configuration, a snap-switch 560 is used to provide a connection between the grounding connections 509a-b and the ground connection 510 of the wiring harness 155. The snap switch 560 may be, for example, a 15 amp, 480 V rated snap switch.

Figure 12:
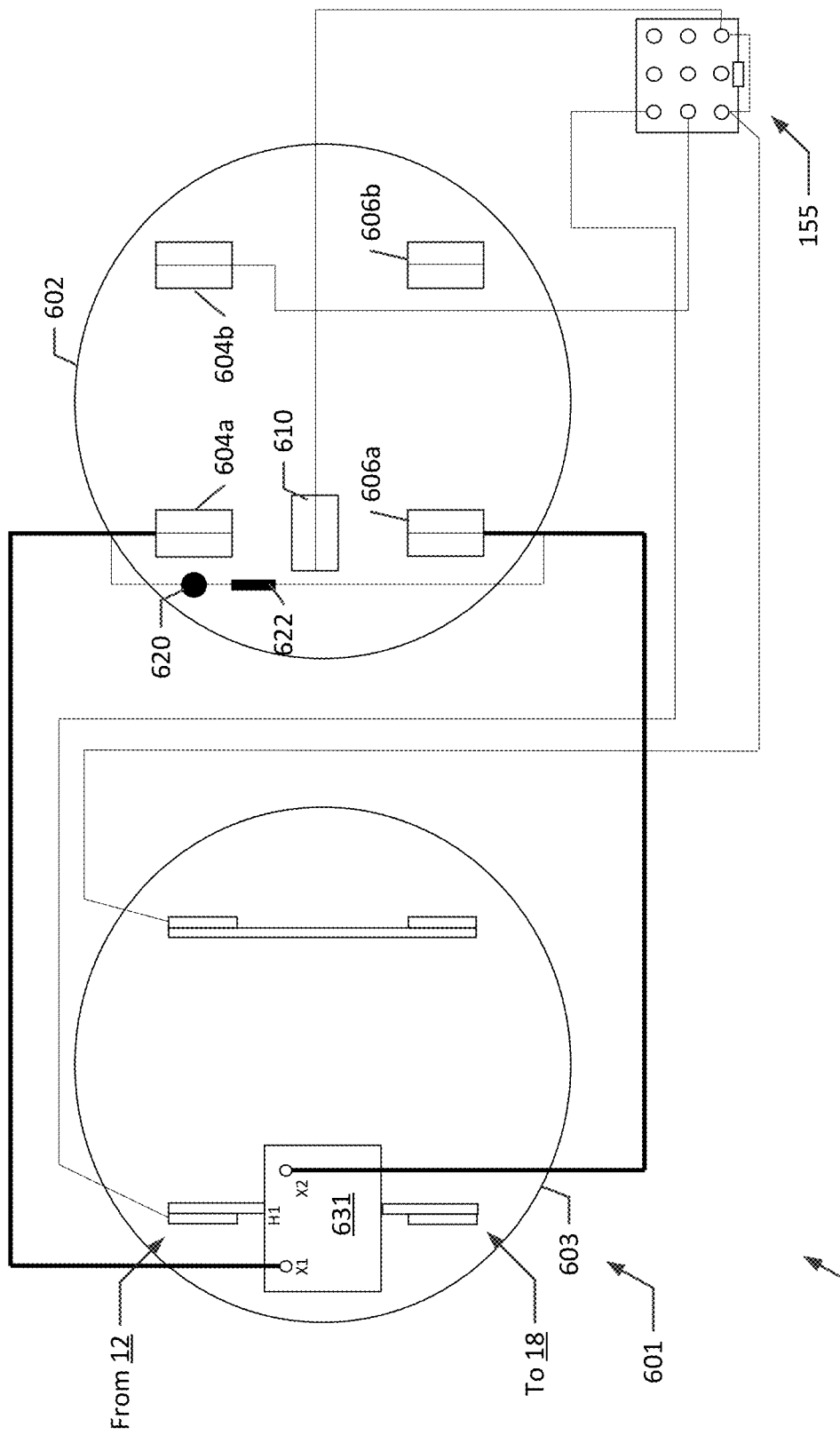
FIG. 12 is a schematic diagram of a portion of an electric meter conversion kit useable in conjunction with a socket configured for a 1S self-contained meter, in an example embodiment.

Referring to FIG. 12, a further embodiment of an electric meter conversion kit 600 is shown. In this embodiment, the electric meter conversion kit 600 is useable to convert a socket compatible with a form 1S self-contained meter into a socket useable with a form 3S transformer-rated electrical meter, e.g., for lower-power industrial applications (e.g., municipal lighting). In this example, a meter socket adapter 601 includes a front face 602 that is electrically connected to a rear side 603. Specifically, in the embodiment shown, at the rear side 603, a single phase electrical service is received at the meter socket 601, at a current transformer 631. Secondary windings of the current transformer 631 are electrically connected to electrical connections 604a, 606a, respectively on a front face 602 of the socket 601, for connection to the form 3S transformer-rated meter that may be installed thereon. Connections 604b, 610 on the front face 602 are electrically connected to a grounding terminal of wiring harness 155, as are unused electrical connections on the rear side 603. The primary electrical service connection 12 is electrically connected to a first connector of the wiring harness 155, and an electrical connection 604b on the front face 602 is electrically connected to a second connector of the wiring harness 155, such that a voltage transformer package may be electrically connected thereto, as noted above. In this embodiment, only a single voltage transformer (not shown) need be used in a voltage transformer assembly that electrically connects to the wiring harness 155. Additionally, connection 604a, 606a are electrically connected by an LED 620 and resistor 622, operation of which is analogous to the description above with respect to FIG. 7, indicating whether the socket is connected.

Referring to FIGS. 1-12 generally, it is noted that a service technician wishing to replace a self-contained meter with a transformer-rated meter will generally be able to, in a simplified manner, retrofit a self-contained meter installation to become a transformer-rated meter installation using a conversion kit as described herein, including a voltage transformer assembly and a meter socket adapter interconnected using a wiring harness. In such an arrangement, voltage transformers of the voltage transformer assembly and current transformers included with (or mounted on a rear side of) the meter socket adapter can be electrically connected in series between an electrical service and a customer premises, while the electrical meter may be transformer-isolated from the service delivered to the customer. The service technician may simply be required to remove a self-contained meter and install a meter socket adapter (with associated current transformer assembly and wiring harness) that is adapted for use with the self-contained meter that was removed. For example, in the case of a K7 meter, the meter socket adapter will be adapted for mounting to bus bars; in the case of a form 9S meter (or other socket-based meter), the meter socket adapter can plug into the existing meter socket of the self-contained meter. A voltage transformer assembly can be mounted either within or adjacent to an enclosure holding the meter, and will include a connector that can be attached to the wiring harness. The connector can be connected to the wiring harness, thereby connecting the voltage transformer assembly to the meter socket adapter, and routing both voltage and current signals to a front face of the meter socket adapter, thereby allowing a transformer-rated meter to be installed at the front face of the meter socket adapter.

Still further although certain meter forms are illustrated in the specific embodiments discussed above, there are certain instances where other meter forms are used and may be converted using the methods and circuits described herein. For example, other meter forms (e.g., Form 5s, form 16s) meters could be adapted as well.

It is noted that in some instances, theoretical errors may occur across the various phases from unbalanced currents across current transformers; however, in typical applications of the present disclosure, such unbalanced currents will not occur due to balanced currents occurring in the applications to which the present systems may be directed (e.g., for industrial lighting applications).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:
1. An electric meter conversion kit comprising:
   an electric meter adapter comprising:
      a wiring harness exposing a plurality of electrical connection sets, each electrical connection set including a plurality of electrical connections associated with each phase of a multi-phase electrical service;

a meter socket adapter having a socket face adapted to receive a plug-in meter, and having a rear side opposite the socket face, wherein the rear side is adapted to connect to a meter socket, and wherein the meter socket adapter includes a plurality of meter connections exposed at the socket face;

a current transformer subassembly including a plurality of current transformers positioned toward the rear side of the meter socket adapter from the socket face, each current transformer being electrically connected between a phase of the multi-phase electrical service and a meter connection of the plurality of meter connections; and a voltage transformer subassembly including a plurality of voltage transformers and a connector, each voltage transformer being electrically connected between a phase of the multi-phase electrical service and an electrical connection of the plurality of electrical connections in the connector, wherein the connector is adapted to be connected to the wiring harness.

2. The electric meter conversion kit of claim 1, wherein the voltage transformer subassembly includes a housing enclosing the plurality of voltage transformers.

3. The electric meter conversion kit of claim 1, wherein the current transformer subassembly is positioned at the rear side of the meter socket adapter.

4. The electric meter conversion kit of claim 1, wherein the meter socket is adapted for use with ft a self-contained meter, and wherein the socket face is adapted to receive a transformer-rated meter.

5. The electric meter conversion kit of claim 1, wherein each electrical connection set of the plurality of electrical connection sets includes an electrical connection to a current transformer of the plurality of current transformers, an electrical connection to the meter connection of the plurality of meter connections, and a ground connection.

6. The electric meter conversion kit of claim 1, wherein the meter socket adapter provides a mounting location for a meter of a predetermined format, the predetermined format being a format selected from a group of meter formats consisting of:
 a form 9S meter;
 a form 4S meter;
 a form 3S meter;
 a form 35S meter; and
 a form 45S meter.

7. The electric meter conversion kit of claim 1, wherein each of the plurality of voltage transformers in the voltage transformer assembly is a toroidal autotransformer.

8. The electric meter conversion kit of claim 1, wherein the meter socket includes a bypass path between a first meter connection and a second meter connection of the plurality of meter connections.

9. The electric meter conversion kit of claim 8, wherein the bypass path includes a resistor and a light-emitting diode.

10. The electric meter conversion kit of claim 1, wherein one or more electrical connections of the plurality of electrical connections in the wiring harness comprise grounding connections, the one or more electrical connections being electrically connected to a ground connection at the rear side of the meter socket adapter and to one or more meter connections of the meter socket adapter.

11. An electric meter circuit installation comprising:
 a meter enclosure housing a meter socket, the meter socket being electrically connected to a power service comprising a multi-phase electrical service and configured to receive a self-contained electric meter;
 a voltage transformer subassembly including a plurality of voltage transformers, each voltage transformer being electrically connected to a phase of the multi-phase electrical service and having a voltage output;
 a meter socket adapter having a connection interface adapted to be connected into the meter socket and a socket face including a plurality of meter connections adapted to accept a transformer-rated meter, wherein the connection interface is on a rear side of the meter socket adapter, and wherein the rear side is opposite the socket face; and
 a current transformer subassembly including a plurality of current transformers positioned toward the rear side of the meter socket adapter from the socket face, each current transformer being electrically connected between a phase of the multi-phase electrical service and a meter connection of the plurality of meter connections.

12. The electric meter circuit installation of claim 11, wherein each voltage transformer of the voltage transformer subassembly is electrically connected to a meter connection of the plurality of meter connections included in the meter socket adapter.

13. The electric meter circuit installation of claim 11, further comprising a wiring harness electrically connecting the voltage transformer subassembly to the meter socket adapter.

14. The electric meter circuit installation of claim 11, wherein the current transformer subassembly is mounted to the rear side of the meter socket adapter.

15. The electric meter circuit installation of claim 14, wherein the voltage transformer subassembly is positioned within a housing and mountable at a meter enclosure.

16. The electric meter circuit installation of claim 15, wherein the voltage transformer subassembly is connected to the meter socket adapter via an electrical connector adapted to be physically intermateable with the wiring harness.

17. The electric meter circuit installation of claim 11, wherein the multi-phase electrical service comprises a three-phase power signal, the voltage transformer subassembly includes first, second, and third voltage transformers, and the current transformer subassembly includes first, second, and third corresponding current transformers.

18. The electric meter circuit installation of claim 17, wherein the first, second, and third voltage transformers comprise toroidal autotransformers.

19. A method of retrofitting a transformer-rated meter into a meter socket adapted for use with a self-contained meter, the method comprising:
 installing a voltage transformer subassembly at an electric meter enclosure, the voltage transformer subassembly including a plurality of voltage transformers;
 installing a meter socket adapter into a meter socket adapted for use with a self- contained meter, the meter socket adapter including a socket face and a rear side opposite the socket face, wherein the socket face has a plurality of meter connections adapted to accept a transformer-rated meter, wherein the rear side is adapted to connect to the meter socket, wherein the meter socket adapter includes a current transformer subassembly including a plurality of current transformers toward the rear side of the meter socket adapter from the socket face, wherein installing the meter socket adapter electrically connects the plurality of current transformers to respective phases of a multi-phase electrical service;

electrically connecting the voltage transformer subassembly to the multi-phase electrical service and the meter socket adapter; and installing a transformer-rated meter into the socket face.

20. The method of claim 19, further comprising:

removing a self-contained meter from the meter socket prior to installing the meter socket adapter.

21. An electric meter conversion kit comprising:

an electric meter adapter comprising:
- a wiring harness exposing a plurality of electrical connection sets, each electrical connection set including a plurality of electrical connections associated with each phase of a multi-phase electrical service;
- a meter socket adapter having a socket face adapted to receive a plug-in meter, the meter socket adapter including a plurality of meter connections exposed at the socket face;
- a current transformer subassembly including a plurality of current transformers, each current transformer being electrically connected between a phase of the multi-phase electrical service and a meter connection of the plurality of meter connections; and
- a voltage transformer subassembly including a plurality of voltage transformers and a connector, each voltage transformer being electrically connected between a phase of the multi-phase electrical service and an electrical connection of the plurality of electrical connections in the connector, wherein the connector is adapted to be connected to the wiring harness;

wherein the meter socket adapter includes a bypass path between a first meter connection and a second meter connection of the plurality of meter connections.

22. The electric meter conversion kit of claim 21, wherein the bypass path includes a resistor and a light-emitting diode.

* * * * *